United States Patent
Akselrod et al.

(10) Patent No.: US 10,295,579 B2
(45) Date of Patent: May 21, 2019

(54) ESTIMATING SOLAR ARRAY POWER GENERATION

(71) Applicant: International Business Machines Corporation, Armonk, NY (US)

(72) Inventors: Ben Z. Akselrod, Givat Shmuel (IL); Anthony Di Loreto, Markham (CA); Steve McDuff, Markham (CA); Kyle D. Robeson, North York (CA)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 15/070,310

(22) Filed: Mar. 15, 2016

(65) Prior Publication Data
US 2016/0238642 A1    Aug. 18, 2016

Related U.S. Application Data

(63) Continuation of application No. 14/623,275, filed on Feb. 16, 2015, now Pat. No. 10,082,529.

(51) Int. Cl.
*G01R 21/133*  (2006.01)
*H02S 50/00*  (2014.01)
*G01W 1/12*  (2006.01)

(52) U.S. Cl.
CPC .......... *G01R 21/133* (2013.01); *G01W 1/12* (2013.01); *H02S 50/00* (2013.01)

(58) Field of Classification Search
CPC ......... G01R 21/133; H02S 50/00; G01W 1/12
See application file for complete search history.

(56) References Cited

U.S. PATENT DOCUMENTS

| | | | |
|---|---|---|---|
| 7,873,490 B2 | 1/2011 | MacDonald | |
| 8,019,117 B2 | 9/2011 | Sasakawa | |
| 8,600,572 B2 | 12/2013 | Sri-Jayantha | |
| 2010/0204844 A1* | 8/2010 | Rettger | H02J 3/06 700/291 |
| 2011/0137591 A1 | 6/2011 | Ishibashi | |
| 2011/0301790 A1 | 12/2011 | Atluri et al. | |
| 2012/0035887 A1* | 2/2012 | Augenbraun | G06T 15/06 703/1 |

(Continued)

FOREIGN PATENT DOCUMENTS

| CN | 102777307 A | 11/2012 |
|---|---|---|
| JP | 2013258853 A | 12/2013 |

OTHER PUBLICATIONS

U.S. Appl. No. 15/070,310, filed Mar. 15, 2016, Entitled "Estimating Solar Array Power Generation", 25 Pages.

(Continued)

*Primary Examiner* — Yoshihisa Ishizuka
(74) *Attorney, Agent, or Firm* — Edward J. Wixted, III

(57) ABSTRACT

In an approach for estimating solar array power generation for an installation of a solar array, a processor determines a location of an installation of a solar array. A processor determines, over a course of a specified time interval, a path of traversal of a source of energy relative to the location of the installation of the solar array. A processor scans an area surrounding the solar array. A processor estimates, based, at least in part, on the path of traversal of the source of energy and the area surrounding the solar array, an amount of power to be generated by the solar array.

7 Claims, 4 Drawing Sheets

(56) References Cited

U.S. PATENT DOCUMENTS

2014/0136131 A1 5/2014 Fujimori et al.
2014/0297072 A1 10/2014 Freeman

OTHER PUBLICATIONS

List of IBM Patents or Patent Applications Treated as Related, Filed Mar. 15, 2016, 2 Pages.
Hussein, Taha Ahmed Tawfik; "Estimation of Hourly Global Solar Radiation in Egypt Using Mathematical Model"; International Journal of Latest Trends in Agriculture & Food Sciences; vol. 2 ; No. 2; Jun. 2012.
Jeong, et al.; "Predicting the Long-Term Behavior of a Micro-Solar Power System"; ACM Transactions on Embedded Computing Systems; vol. 11; No. 2; Article 35; Publication Date: Jul. 2012.
U.S. Appl. No. 14/623,275, filed Feb. 16, 2015, Entitled "Estimating Solar Array Power Generation", 29 Pages.
List of IBM Patents or Patent Applications Treated as Related, Dated Mar. 15, 2016, 2 Pages.

* cited by examiner

ESTIMATING SOLAR ARRAY POWER GENERATION

BACKGROUND OF THE INVENTION

The present invention relates generally to the field of solar power technology, and more particularly to determining an amount of sunlight received by a solar array over a time interval in order to estimate how much power is generated by the solar array.

A solar array is a power system designed to supply usable solar power by means of photovoltaics. A solar array consists of an arrangement of several components, including multiple solar panels to absorb and directly convert sunlight into electricity, a solar inverter to change the electrical current from direct current (DC) to alternating current (AC), as well as mounting, cabling, and other accessories to set up a working system. A solar array encompasses the ensemble of solar panels, the visible part of the photovoltaic system, and does not include the other hardware that is often summarized as the balance of system.

Solar panel refers to a photovoltaic module, solar hot water panel, or set of solar photovoltaic modules electrically connected and mounted on a supporting structure. A photovoltaic module is a packaged, connected assembly of solar cells. Solar panels can be used as a component of a larger photovoltaic system to generate and supply electricity in commercial and residential applications. A single solar module can produce a limited amount of power; most installations include multiple modules.

Sunlight is a portion of the electromagnetic radiation given off by the sun, in particular infrared, visible, and ultraviolet light. On Earth, sunlight is filtered through the Earth's atmosphere, as daylight is when the sun is above the horizon. When direct solar radiation is not blocked by clouds, there is an experience of sunshine, a combination of bright light and radiant heat. When the direct solar radiation is blocked by the clouds or reflects off other entities, there is an experience of diffused light. The cumulative time during which an area receives direct irradiance from the sun of at least 120 watts per square meter is called sunshine duration.

A global positioning system (GPS) is a space-based satellite navigation system that provides location and time information in all weather conditions, anywhere on or near the Earth where there is an unobstructed line of sight to four or more GPS satellites. GPS provides critical capabilities to military, civil, and commercial users around the world. GPS is maintained by the United States government and is freely accessible to anyone with a GPS receiver.

SUMMARY

Aspects of an embodiment of the present invention disclose a method, computer program product, and computing system for estimating solar array power generation for an installation of a solar array. A processor determines a location of an installation of a solar array. A processor determines, over a course of a specified time interval, a path of traversal of a source of energy relative to the location of the installation of the solar array. A processor scans an area surrounding the solar array. A processor estimates, based, at least in part, on the path of traversal of the source of energy and the area surrounding the solar array, an amount of power to be generated by the solar array.

DETAILED DESCRIPTION

With the current state of solar power technology, solar array technology advances and electric cars with solar arrays have become more prevalent. The amount of sun that a car is exposed to throughout the day has an effect on the length of time the vehicle can be used before the need to use a charging station.

Embodiments of the present invention recognize the need for a user to be assured that the user's object, which includes solar panels, whether the solar panels are on a vehicle or house, will be charged enough to be able to satisfy the user's needs throughout a day or night. A user could have a variety of needs, depending on whether the object is mobile or stationary. For example, if the object is mobile, the user's needs may include a vehicle having enough power to return home after work without stopping by a charging station. On the other hand, if the object is stationary, the user's needs may include having enough power to host a party that would require more power than a typical day. Embodiments of the present invention detail a program that can be used to identify how much sunlight the solar array will receive over an interval of time, and therefore, how much power the solar array might generate.

Embodiments of the present invention will now be described in detail with reference to the Figures.

Figure 1:
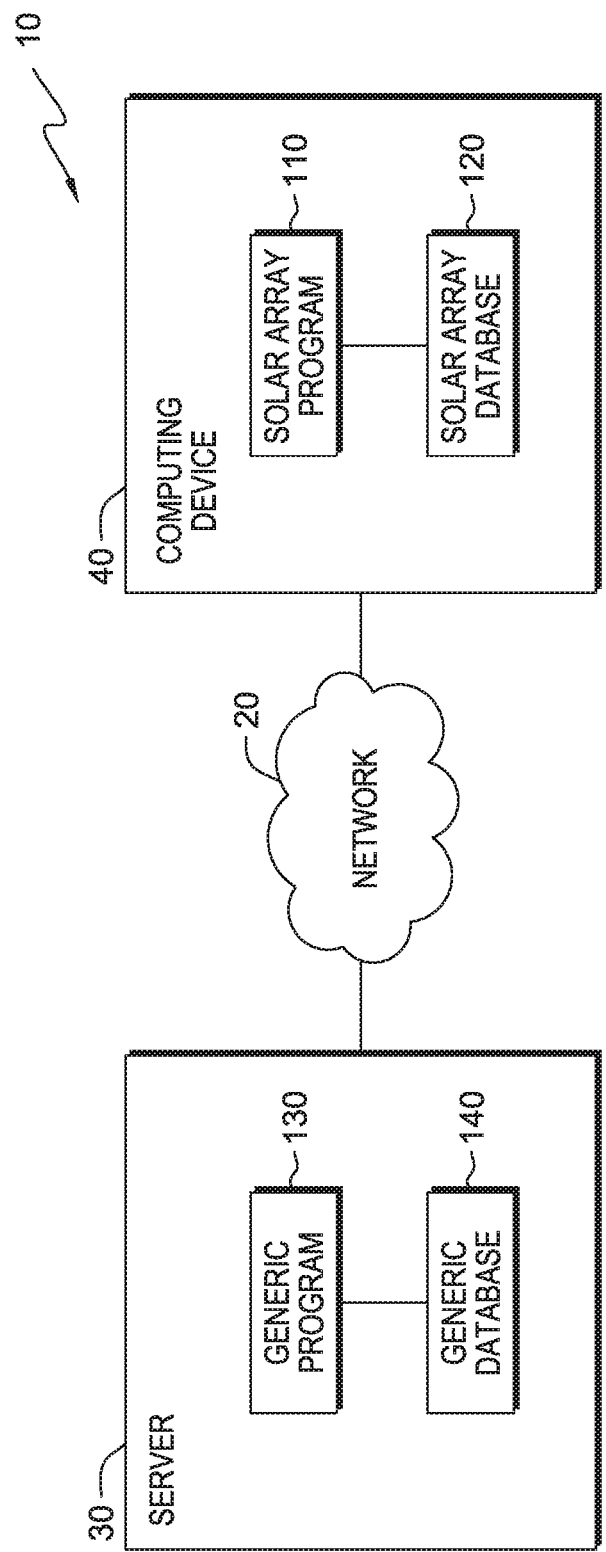
FIG. 1 depicts a block diagram of a computing system, in accordance with an embodiment of the present invention.

FIG. 1 depicts a block diagram of computing system 10, in accordance with one embodiment of the present invention. FIG. 1 provides an illustration of one embodiment and does not imply any limitations with regard to the environments in which different embodiments may be implemented.

In the depicted embodiment, computing system 10 includes server 30 and computing device 40 interconnected over network 20. Network 20 may be a local area network (LAN), a wide area network (WAN) such as the Internet, a cellular data network, any combination thereof, or any combination of connections and protocols that will support communications between server 30 and computing device 40, in accordance with embodiments of the invention. Network 20 may include wired, wireless, or fiber optic connections. Computing system 10 may include additional computing devices, servers, or other devices not shown.

Server 30 may be a management server, a web server, or any other electronic device or computing system capable of processing program instructions and receiving and sending data. In some embodiments, server 30 may be a laptop computer, tablet computer, netbook computer, personal computer (PC), a desktop computer, or any programmable electronic device capable of communicating with computing device 40 via network 20. In other embodiments, server 30 may represent a server computing system utilizing multiple computers as a server system, such as in a cloud computing environment. In another embodiment, server 30 represents a computing system utilizing clustered computers and components to act as a single pool of seamless resources. In the depicted embodiment, server 30 contains generic program 130 and generic database 140. In other embodiments, server 30 may include generic program 130, generic database 140, and/or other components, as depicted and described in further detail with respect to FIG. 4.

Computing device 40 may be a desktop computer, laptop computer, netbook computer, or tablet computer. In general, computing device 40 may be any electronic device or computing system capable of processing program instructions, sending and receiving data, and communicating with server 30 via network 20. In the depicted embodiment, computing device 40 contains solar array program 110 and solar array database 120. In other embodiments, computing device 40 may include solar array program 110, solar array database 120, and/or other components, as depicted and described in further detail with respect to FIG. 4.

Solar array program 110 estimates solar array power generation for objects throughout the course of a specified time interval. In doing so, solar array program 110 receives an indication of start-up and/or stoppage of an object (e.g., automobile or boat) that holds the installation of the solar array. Throughout the application, holding the installation of the solar array means that the solar array is installed on top of, under, inside, or, otherwise, attached to the object. Solar array program 110 determines a path of traversal of a source of energy relative to the location of the installation of the solar array. Solar array program 110 scans the area surrounding the solar array. Solar array program 110 estimates the power generation and notifies a user. In the depicted embodiment, solar array program 110 resides on computing device 40. In other embodiments, solar array program 110 may reside on another computing device, server, or server 30, provided that solar array program 110 can access solar array database 120, generic program 130, and generic database 140 via network 20.

Solar array database 120 may be a repository that may be written to and/or read by solar array program 110. In some embodiments, a program (not shown) may allow an administrator or other user to define various maps and GPS coordinates and store to solar array database 120. In other embodiments, solar array database 120 may store already determined paths or estimations of power. For example, if a user parks in the same location for work every day, solar array program 110 can determine power estimation during each season for a typical work day and store that information to solar array database 120. In the depicted embodiment, solar array database 120 resides on computing device 40. In other embodiments, solar array database 120 may reside on another computing device, server, or server 30, provided that solar array database 120 is accessible to solar array program 110 via network 20.

Generic program 130 may be any program on server 30 that may be accessed by solar array program 110 over network 20. For example, generic program 130 may be an application or program that is designed to obtain information concerning various weather activities and seasonal information, such as sunrise and/or sunset times. Solar array program 110 may use current information gathered by generic program 130 to obtain precise, current or future weather pattern information.

Generic database 140 may be any database on server 30 that may be accessed by solar array program 110 over network 20. For example, generic database 140 may be a repository that stores prior or current weather pattern information obtained by a program or application. Solar array program 110 may use archived information stored to generic database 140 to obtain historical weather pattern information.

Figure 2:
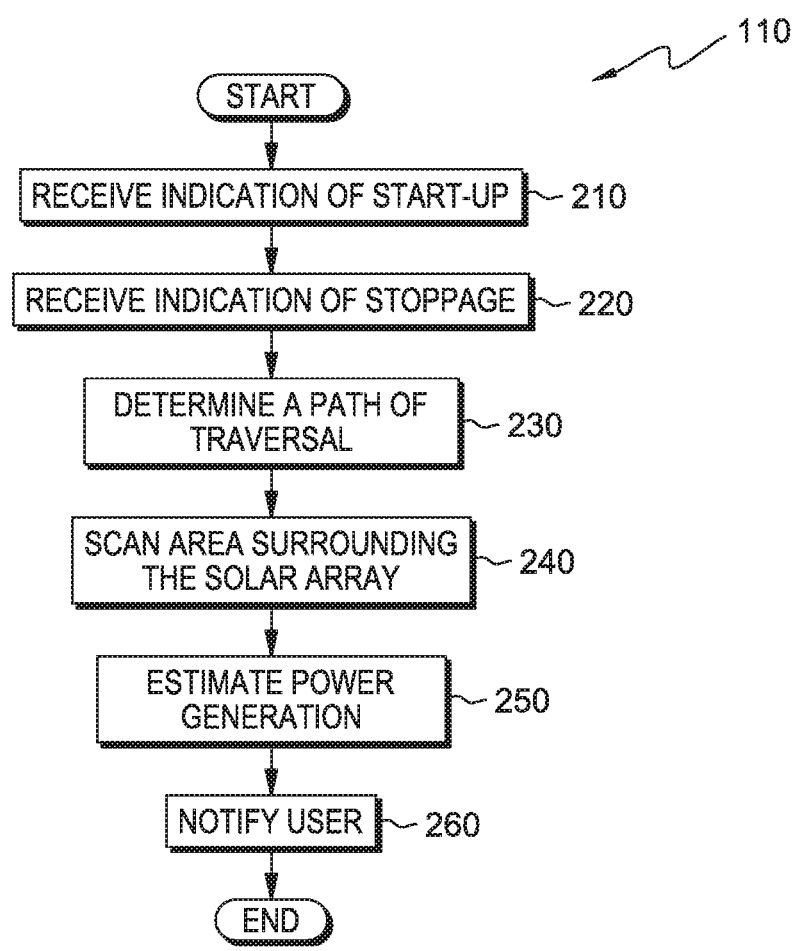
FIG. 2 depicts a flowchart of the steps of a solar array program, executing within the computing system of FIG. 1, for estimating solar array power generation for objects throughout the course of a specified time interval, in accordance with an embodiment of the present invention.

FIG. 2 depicts a flowchart of the steps of a solar array program, executing within the computing system of FIG. 1, in accordance with an embodiment of the present invention. Solar array program 110 estimates solar array power generation for objects throughout the course of a specified time interval.

In step 210, solar array program 110 receives indication of start-up of an object (e.g., automobile or boat) that holds the installation of the solar array. In some embodiments, solar array program 110 receives an indication of start-up from starting the ignition of an automobile, boat, or other type of vehicle. In other embodiments, solar array program 110 receives an indication of start-up from the push of a button, or any other type of switch that could be used to alert a program related to the installation of the solar array to begin. The button, or switch, could also be used for a stationary solar array. Although the button, or switch, would be more prevalent on a stationary solar array, the button, or switch, could also be used for a moving solar array. The button, or switch, would allow the driver of a vehicle to choose a starting and stopping point that is different from the starting and stopping of the vehicle's ignition. Still, in some embodiments, solar array program 110 does not receive an indication of start-up and runs continuously.

In step 220, solar array program 110 receives indication of stoppage of an object (e.g., automobile or boat) that holds the installation of the solar array. In one embodiment, solar array program 110 receives an indication of stoppage from turning off the ignition of an automobile, boat, or other type of vehicle. In other embodiments, solar array program 110 receives an indication of stoppage from the push of a button, or any other type of switch that could be used to alert an object that holds the installation of the solar array to stop. The button, or switch, could be used on a stationary solar array. Although the button, or switch, would be more prevalent on a stationary solar array, the button, or switch, could also be used in a moving solar array. The button, or switch, would allow the driver of a vehicle to choose a starting and stopping point that is different from the starting and stopping of the vehicle's ignition.

In some embodiments, solar array program 110 may continue without receiving an indication of stoppage of an object (e.g., automobile or boat) that holds the installation of the solar array program related to the installation of the solar array. In such an embodiment, a user may input a location where the user wishes to park, and solar array program 110 plots the relative position of the sun over an interval of time at the specified location.

In step 230, solar array program 110 determines, over a course of a specified time interval (e.g., three hours, eight hours, all day), a path of traversal of a source of energy relative to the location of the installation of the solar array.

In one embodiment, the specified time interval is given by the user. For example, the user may only want information during the user's workday. In other embodiments, the specified time interval is determined by solar array program 110, based on prior user needs. For example, solar array program 110 may use the information stored to solar array database 120 for particular days of the week to provide a time interval that suits the user's needs.

In one embodiment, solar array program 110 retrieves an already plotted path of traversal from solar array database 120 or generic database 140. For example, on a certain day in a certain time zone, there may be information about the path of the sun for various types of locations (e.g., cities, farms, etc.). In other embodiments, solar array program 110 uses sensors, such as a global positioning system (GPS) or a compass, to plot the path of traversal. For example, solar array program 110 may use a range finder type sensor to follow the path of the sun over the specified time interval. Whenever the range finder returns a value that is not infinite, there is an obstructing entity between the solar array and the path of the sun, indicating, for example, shadows on the solar array. In one embodiment, solar array program 110 uses a single sensor device that rotates. In other embodiments, solar array program 110 uses multiple sensor devices that can be correlated or synced.

In one embodiment, the sensors are located on or near the installation of the solar array. In other embodiments, the sensors are not located on or near the installation of the solar array, but instead are located on a building or other structure near the installation of the solar array, such that solar array program 110 may retrieve the information from other locations.

In step 240, solar array program 110 scans an area surrounding the solar array. In one embodiment, solar array program 110 retrieves a map of one or more entities in existence between the installation of the solar array and the path of traversal of the source of energy over the course of the specified time interval from solar array database 120 or generic database 140. For example, the map may have been previously used by another user from a certain day in the same area that relates to the entities in the area surrounding the current user's solar array. In other embodiments, solar array program 110 creates a map of entities that exist between the solar array and the path of the sun throughout the course of the specified time interval. For example, the entities could be stationary (e.g., building or house) or could move (e.g., food truck) throughout the course of the specified time period. Solar array program 110 uses the map to identify time intervals and particular times when the solar array is in the shadow of the entities (i.e., at least partially blocked) that exist between the solar array and the path of the sun, assuming no cloud coverage or other events unaffected by vehicle placement, for example, a solar eclipse.

In one embodiment, solar array program 110 creates the map throughout a day while the vehicle is parked, tracking stationary entities and movement of entities that block the source of energy from the solar array, and the power estimation is performed at the end of the day. In other embodiments, solar array program 110 creates the map when the vehicle is parked, and the power estimation is done at that time. Additionally, in some embodiments, solar array program 110 identifies the type of entity that is blocking the solar array from the sun. For example, solar array program 110 may identify that the entity is a building, truck, tree, etc.

In step 250, solar array program 110 estimates power generation. In one embodiment, solar array program 110 takes into account weather patterns throughout the day to identify levels of cloud coverage. In some embodiments, solar array program 110 retrieves the weather pattern information from data previously stored to solar array database 120. In other embodiments, solar array program 110 receives the weather pattern information from generic program 130. For example, generic program 130 may be an application or program that is designed to obtain information concerning various weather activities for specified locations. Still, in some embodiments, solar array program 110 retrieves the weather pattern information from generic database 140. For example, generic database 140 may be a repository that stores prior or current weather pattern information obtained by a program or application.

The information obtained by solar array program 110, for example, weather pattern information, the path of traversal of the source of energy, and/or the map of entities, is used to estimate how much power is generated by the solar array and if that generated power would be enough to satisfy the needs of the user. In various embodiments of the present invention, solar array program 110 calculates the estimation of power generated by the solar array using known methods. In some embodiments, the user knows the amount of power needed for a particular task. For example, the user may know that it takes 30 miles to get home from work, and solar array program 110 determines how many miles the estimated power generation will carry the user. In another example, the output from solar array program 110 may be in terms of power, such as, 50 kWh (kilowatt-hour). If the user knows it takes 40 kWh to travel 30 miles, then the user knows there is enough power to travel home from work. Solar array program 110 can estimate (i.e., calculate) the power generation by any means that allow a user to determine if the amount of power generated is high enough for what the user may require. In one embodiment, the user determines if the estimated power generated is sufficient. In other embodiments, solar array program 110 determines if the estimated power generated is sufficient. In one embodiment, for example, the estimation may be based, at least in part, on the path of traversal of the source of energy and the area surrounding the solar array.

Unlike solar arrays placed on stationary objects, such as a house, solar arrays placed on a vehicle have a wide range of acceptable light exposed to the solar array. Solar array program 110 provides a way for the vehicle to identify not just how much sunlight the vehicle is currently exposed, but how much sunlight the vehicle is likely to be exposed to throughout the day, assuming the vehicle stays in its current location.

In step 260, solar array program 110 notifies a user. The information determined by solar array program 110 in step 250, for example, an estimate of power generated, is filtered back to the user, so the user can decide how to proceed. In one embodiment, solar array program 110 notifies a user of the installation of the solar array of the particular times in which the installation of the solar array is at least partially blocked from the source of energy. In some embodiments, solar array program 110 notifies the user through an audio system, such as a phone call, radio transmission, or through a navigation system's audio output. In other embodiments, solar array program 110 notifies the user through a visual system, such as a text message, email, or a message on a navigation system's display unit. In one embodiment, solar array program 110 only gives the amount of power generated. In other embodiments, solar array program gives the amount of power generated and suggests to the user whether or not the power generated is enough for the user's need. Still, in some embodiments, solar array program 110 notifies the user that a structure is blocking the source of energy from reaching the solar array and suggests that the user move the vehicle.

Figure 3B:
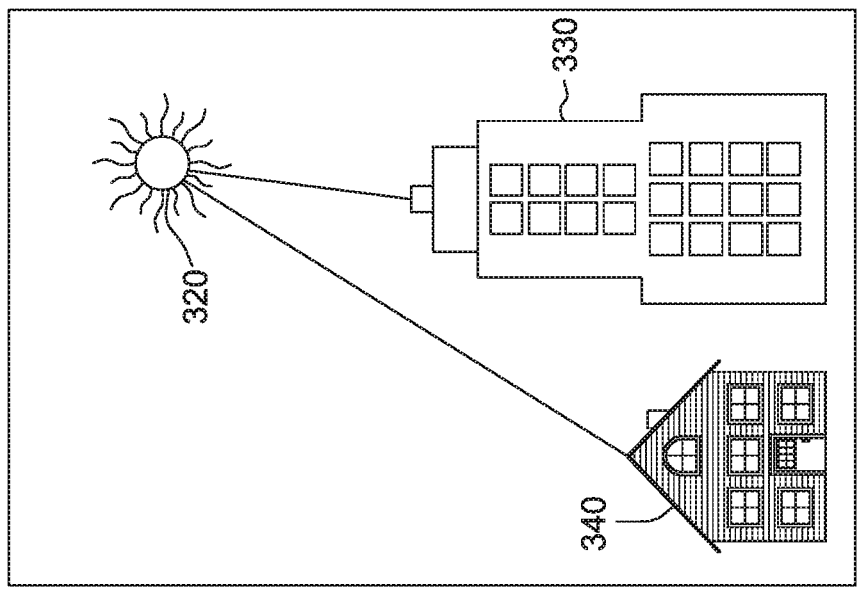
FIG. 3B depicts an example of a house that is partially blocked from the sun by a building, in accordance with an embodiment of the present invention.
Figure 3A:
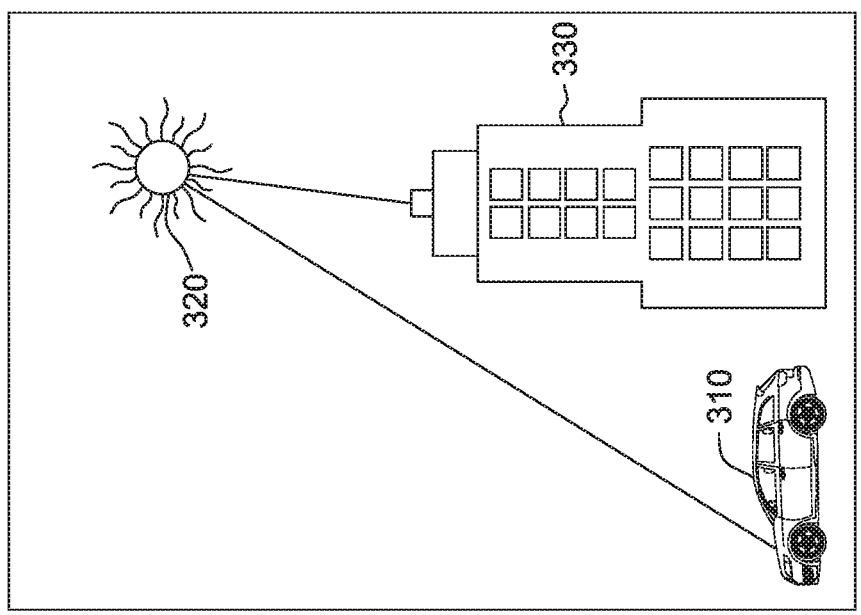
FIG. 3A depicts an example of a parked car that is partially blocked from the sun by a building, in accordance with an embodiment of the present invention.

FIGS. 3A and 3B depict examples of objects that are partially blocked from the sun by an entity (e.g., a building), in accordance with an embodiment of the present invention.

FIG. 3A depicts mobile object 310, solar power unit 320, and obstructing structure 330. In the depicted embodiment, mobile object 310 is a car. In other embodiments, mobile object 310 could be a motorcycle, boat, or any other mobile object that uses a solar array to generate power. In the depicted embodiment, solar power unit 320 is the sun. In other embodiments, solar power unit 320 could be any other unit, occurring in nature or synthetic, that creates solar power similar to the sun that could be used by a solar array to generate power. In the depicted embodiment, obstructing structure 330 is a building. In other embodiments, obstructing structure 330 could be any other entity, such as a monument, statue, house, etc., that could cause mobile object 310 to be blocked from solar power unit 320.

As an example, in step 210 and/or 220 of FIG. 2, solar array program 110 may receive an indication of start-up and/or stoppage of an object (e.g., mobile object 310) that holds the installation of the solar array. In some embodiments, solar array program 110 receives an indication of start-up from a user starting the ignition of mobile object 310. In other embodiments, solar array program 110 receives an indication of stoppage from a user turning off the ignition of mobile object 310.

FIG. 3B depicts stationary object 340, solar power unit 320, and obstructing structure 330. In the depicted embodiment, stationary object 340 is a house. In other embodiments, stationary object 340 could be a building, factory, or any other stationary object that uses a solar array to generate power. In the depicted embodiment, solar power unit 320 and obstructing structure 330 are similar to the depiction in FIG. 3A.

As an example, in step 240 of FIG. 2, solar array program 110 may find obstructing structure 330 during the scan of the area surrounding the solar array and determine that obstructing structure 330 is a building. In some embodiments, solar array program 110 determines certain characteristics (e.g., height, width, etc.) of obstructing structure 330, which assists in the estimation of power generation in step 250.

Solar array program 110 optimizes vehicle positioning by using predictive methods. Solar array program 110 allows vehicles to take advantage of areas that might, at a current time, be in the shade, but for the majority of the day may be in the sunlight and able to generate power. Similarly, users would be able to avoid spots that at the current time are sunlit, but will not be in an hour. Additionally, solar array program 110 is not just limited to vehicles. Solar array program 110 could be used to assist with the installation of solar arrays on houses, or other stationary objects, that may be blocked from direct sunlight at some interval of time during the day.

Figure 4:
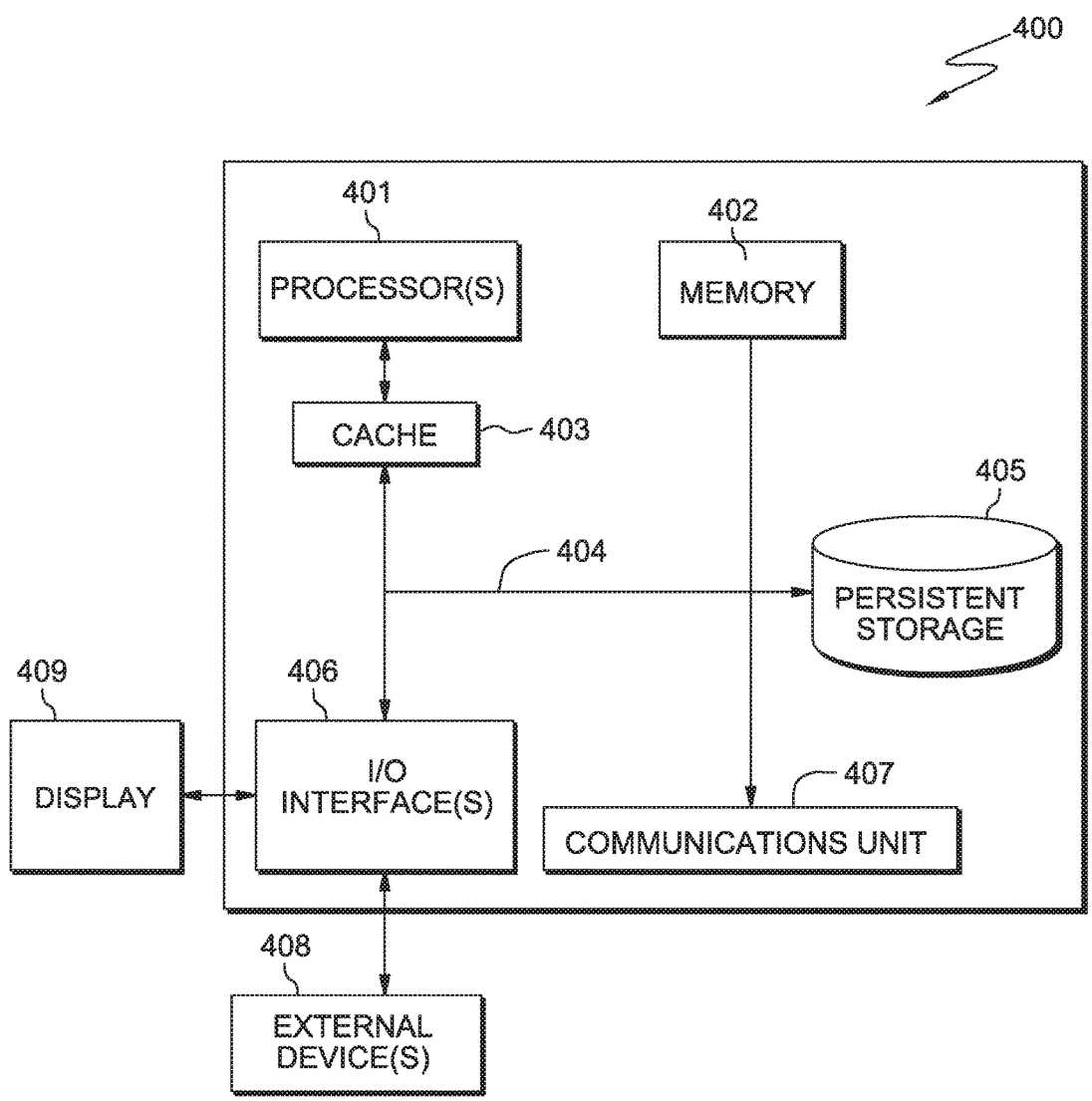
FIG. 4 depicts a block diagram of components of the server and/or the computing device, in accordance with an embodiment of the present invention.

FIG. 4 depicts computer system 400, which is an example of a system that includes components of server 30 and/or computing device 40. Computer system 400 includes processors 401, cache 403, memory 402, persistent storage 405, communications unit 407, input/output (I/O) interface(s) 406 and communications fabric 404. Communications fabric 404 provides communications between cache 403, memory 402, persistent storage 405, communications unit 407, and input/output (I/O) interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processors 401 by holding recently accessed data, and data near recently accessed data, from memory 402.

Program instructions and data used to practice embodiments of the present invention may be stored in persistent storage 405 and in memory 402 for execution by one or more of the respective processors 401 via cache 403. In an embodiment, persistent storage 405 includes a magnetic hard disk drive. Alternatively, or in addition to a magnetic hard disk drive, persistent storage 405 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405.

Communications unit 407, in these examples, provides for communications with other data processing systems or devices. In these examples, communications unit 407 includes one or more network interface cards. Communications unit 407 may provide communications through the use of either or both physical and wireless communications links. Program instructions and data used to practice embodiments of the present invention may be downloaded to persistent storage 405 through communications unit 407. Generic program 130 and generic database 140 may be downloaded to persistent storage 405 of server 30 through communications unit 407 of server 30. Solar array program 110 and solar array database 120 may be downloaded to persistent storage 405 of computing device 40 through communications unit 407 of computing device 40.

I/O interface(s) 406 allows for input and output of data with other devices that may be connected to each computer system. For example, I/O interface 406 may provide a connection to external devices 408 such as a keyboard, keypad, a touch screen, and/or some other suitable input device. External devices 408 can also include portable computer readable storage media such as, for example, thumb drives, portable optical or magnetic disks, and memory cards. Software and data used to practice embodiments of the present invention, e.g., generic program 130 and generic database 140, can be stored on such portable computer readable storage media and can be loaded onto persistent storage 405 of server 30 via I/O interface(s) 406 of server 30. Software and data used to practice embodiments of the present invention, e.g., solar array program 110 and solar array database 120, can be stored on such portable computer readable storage media and can be loaded onto persistent storage 405 of computing device 40 via I/O interface(s) 406 of computing device 40. I/O interface(s) 406 also connect to display 409.

Display 409 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:

determining, by one or more processors, a location of a solar array attached to a mobile device, based on geolocation, time, and directional information from a first set of one or more sensors that is attached to the mobile device, wherein the first set of one or more sensors includes a global positioning system (GPS) and a compass;

causing, by one or more processors, a focal point of a second set of one sensor to follow a path of traversal of a source of energy, wherein the second set of one sensor provides distance information;

determining, by one or more processors, over a course of a specified time interval, the path of traversal of the source of energy relative to the location of the solar array, based on distance information from the second set of one sensor that is attached to the mobile device and based on geolocation, time, and directional information from a third set of one or more sensors that are attached to a stationary structure, wherein the second set of one sensor includes a rangefinder and the third set of one or more sensors includes a GPS and a compass, and wherein the specified time interval is determined by a user;

scanning, by one or more processors, an area surrounding the solar array, based on information received from the first set of one or more sensors, the second set of one sensor, and the third set of one or more sensors, wherein the first set of one or more sensors, the second set of one sensor, and the third set of one or more sensors are installed and synced to allow information to be received from a plurality of locations;

estimating, by one or more processors, based, at least in part, on the path of traversal of the source of energy and the area surrounding the solar array, an amount of power to be generated by the solar array; and notifying, by one or more processors, the user whether the amount of power to be generated by the mobile solar array is enough to satisfy a traveling need of the user, wherein the traveling need of the user is based on a current location of the mobile device and a future desired location of the mobile device.

2. The method of claim 1, further comprising:

plotting, by one or more processors, the path of traversal of the source of energy relative to the solar array over the course of the specified time interval; and generating, by one or more processors, a map of one or more entities in existence between the solar array and the path of traversal of the source of energy.

3. The method of claim 2, further comprising:

determining, by one or more processors, based, at least in part, on the plotted path of traversal and the map of one or more entities, one or more particular time intervals in which the solar array is at least partially blocked from the source of energy.

4. The method of claim 3, further comprising:

notifying, by one or more processors, the user of the solar array of the one or more particular time intervals in which the solar array is at least partially blocked from the source of energy.

5. The method of claim 1, further comprising:

retrieving, by one or more processors, a map of one or more entities in existence between the solar array and the path of traversal of the source of energy over the course of the specified time interval.

6. The method of claim 1, further comprising:

notifying, by one or more processors, the user of the solar array of the estimate of the amount of power generated by the solar array.

7. The method of claim 1, wherein determining a path of traversal of a source of energy comprises:

using, by one or more processors, at least one sensor to determine the path of traversal of the source of energy relative to the solar array.

* * * * *